United States Patent
Isobe et al.

[11] Patent Number: 5,814,917
[45] Date of Patent: Sep. 29, 1998

[54] SURFACE ACOUSTIC WAVE EQUIPMENT

[75] Inventors: Atsushi Isobe, Kodaira; Mitsutaka Hikita; Chisaki Takubo, both of Hachioji; Kengo Asai, Kokubunji, all of Japan

[73] Assignee: Hitachi Media Electronics Co., Ltd., Iwate-ken, Japan

[21] Appl. No.: 676,683

[22] Filed: Jul. 10, 1996

[30] Foreign Application Priority Data

Jul. 11, 1995 [JP] Japan ................................ 7-174859

[51] Int. Cl.$^6$ ................................ H01L 41/04
[52] U.S. Cl. ................ 310/313 B; 310/320; 310/313 R
[58] Field of Search ................ 310/320, 313 B, 310/311, 313 R, 313 A

[56] References Cited

U.S. PATENT DOCUMENTS

| | | | |
|---|---|---|---|
| 3,858,064 | 12/1974 | Schissler | 310/8.1 |
| 3,863,497 | 2/1975 | Van De Vaart et al. | 73/71.2 |
| 3,894,286 | 7/1975 | Armstrong | 325/438 |
| 3,940,636 | 2/1976 | Perahia | 310/8.1 |
| 5,506,552 | 4/1996 | Seki et al. | 333/195 |

*Primary Examiner*—Mark O. Budd
*Assistant Examiner*—Timothy A. Williams
*Attorney, Agent, or Firm*—Antonelli, Terry, Stout & Kraus, LLP

[57] ABSTRACT

Aluminum is used for the interdigital transducer mounted on a piezoelectric substrate to realize a surface acoustic wave transducer having a small capacity ratio, no spurious resonance, and a low loss. A $\theta$ rotated Y cut lithium niobate single crystal piezoelectric substrate is used for the piezoelectric material, a metal film of which principal ingredient is aluminum is used for the interdigital transducer, the direction of the interdigital transducer is made parallel to the X-axis of the lithium niobate single crystal, and thick h and electrode pitch P of the interdigital transducer have the following relationship:

$$(\theta+5)^2/300+11/12 \leq h/P \times 100-8 \leq -0.0001 \times (\theta+5)^3 + 0.1625 \times (\theta+5) + 5.5$$

and $$-30 \leq \theta \leq 20.$$

12 Claims, 7 Drawing Sheets

SURFACE ACOUSTIC WAVE EQUIPMENT

BACKGROUND OF THE INVENTION

The present invention relates to a surface acoustic wave (SAW) equipment and, more particularly, to a piezoelectric material for a SAW transducer and a constitution of an interdigital transducer (IDT) for use in communications devices as well as to apparatuses using the SAW equipment.

A SAW transducer constituting SAW equipment is made up by providing an interdigital transducer having electrode fingers on a planar surface of piezoelectric material. Such a SAW transducer is used on communication devices and others as a solid state circuit element such as a resonator and a filter.

In characteristic, the SAW transducer used on a communication device is required to have a small capacity ratio that provides a guideline for indicating a conversion efficiency between mechanical vibration and electric oscillation. Conventionally, a small-capacity-ratio transducer for a SAW resonator is constituted by forming an interdigital transducer (IDT) formed by patterning a metal film mainly composed of gold (Au) on a planar surface of a Y-cut lithium niobate single crystal piezoelectric substrate in a direction parallel to the X-axis. In this case, the electrode of the IDT needs to be a metal mainly composed of Au and have a ratio of electrode film thickness h and electrode pitch P of the IDT is 2% (hereinafter referred to as Au 2%/YX-LN) (for example, refer to the 20th Wave Device And Frequency Control Symposium Draft, 1991, pp. 115–120).

A variety combinations of SAW transducer's metal electrode materials, metal electrode film thicknesses, cut angles of piezoelectric materials, and directions of IDT were investigated by the propagation velocity computational simulator proposed by Campbell et al. (for example, J. Appl. Phys., Vol. 43, No. 3 (1972), pp. 856–862).

In a transducer for a SAW resonator using a piezoelectric material that can form a large-sized single crystal, the above-mentioned combination, namely Au 2%/YX-LN, is only the combination that makes capacity ratio $\gamma$ lower than 3. The above-mentioned simulation concluded that, if aluminum (Al) is used for Au, the capacity ratio $\gamma$ cannot be made small at all.

In addition to having a small capacity ratio $\gamma$, it is required for a SAW transducer for use in communication devices and the like to have such excellent characteristics as no spurious resonance and a large resonant Q value and an antiresonant Q value. Further, the SAW transducer has excellent economy; namely, it can be produced less costly. Since the conventional Au 2%/YX-LN uses costly Au for the metal electrode film material to make the above-mentioned capacity ratio $\gamma$ small, the fabrication cost of the SAW resonator using such a material cannot be reduced. Further, since Au is used for the metal electrode film material, the fabrication of the SAW transducer requires a production line separate from that of other SAW equipment (which use Al for the metal electrode film material). This increases the cost of production facilities, preventing the fabrication cost of the SAW transducer from getting lower. Thus, conventional SAW resonators and the like having a low capacity ratio are extremely costly, thereby making it difficult to lower the costs of the resonator, filter, oscillator and correlator which use such costly SAW resonators, and the cost of communication devices using these components.

Meanwhile, some SAW transducers using a 64-degree rotated Y-cut lithium niobate single crystal for the piezoelectric substrate use Al for the metal electrode film material. However, since the thickness of the metal electrode film does not affect the characteristics of those SAW transducers, the extremely thin material is used, making its capacity ratio $\gamma$ as high as about 10.

SUMMARY OF THE INVENTION

It is therefore a main object of the present invention to provide a SAW transducer being low in fabrication cost and having a small capacity ratio $\gamma$ and a communication device using this SAW transducer.

It is another object of the present invention to provide a SAW transducer using Al for the metal electrode film material and having a small capacity ratio $\gamma$.

It is still another object of the present invention to provide a $\theta$ rotated Y cut lithium niobate single crystal SAW transducer that achieves the above-mentioned objects, has no spurious resonance, and has large resonant and antiresonant Q values.

In carrying out the invention and according to one aspect thereof, we determined the thickness h of the electrodes of the interdigital transducer (IDT) and the pitch P of the these electrodes such that, mainly because of the trap of a surface acoustic wave at the edge of an electrode finger of an interdigital transducer, the propagation velocity of the surface acoustic wave oscillated by the interdigital transducer is slower than that of an elastic wave, which is a non-surface wave, unique to a material having a velocity vector in the same direction as the surface acoustic wave and independent of a shape of the interdigital transducer or material.

Especially, for a preferred mode, a $\theta$ rotated Y cut lithium niobate single crystal piezoelectric substrate is used for the piezoelectric material, a metal film mainly composed of Al is used for the interdigital transducer, and the direction of the interdigital transducer is made parallel to the X-axis of the lithium niobate crystal to provide the following relations:

$$(\theta+5)^2/300+11/12 \leq h/P \times 100-8 \leq -0.0001 \times (\theta+5)^3 + 0.1625 \times (\theta+5) + 5.5$$

and $$-30 \leq \theta \leq 20$$

thereby eliminating spurious resonance.

The above-mentioned $\theta$ rotated Y cut lithium niobate single crystal piezoelectric substrate denotes a lithium niobate single crystal piezoelectric substrate with the lithium niobate single crystal cut generally perpendicular (with an error less than one degree) to the direction tilted by $\theta$ degrees from +Y axis of IRE standard to +Z axis of IRE standard or from -Y axis of IRE standard to -Z axis of IRE standard.

The Q values were increased to realize a low loss by providing the following relations:

$$0.001 \times \theta + 0.12 \leq h/P$$

and $$-30 \leq \theta < -10$$

or $$0.11 \leq h/P$$

and $$-10 \leq \theta \leq 30.$$

Further, the capacity ratio was made lower than 3 by providing the following relations:

$$-0.005 \times \theta + 0.07 \leq h/P \leq -0.004 \times \theta + 0.18 - 10 \leq \theta \leq 20$$

and $$0.07 \leq h/P \leq 0.14.$$

As described and according to the present invention, the SAW transducer is used in which the interdigital transducer made of the metal film mainly composed of aluminum is formed on the θ rotated Y cut lithium niobate single crystal piezoelectric substrate, the interdigital transducer being made parallel to the X axis of the lithium niobate crystal and the angle θ and the thickness h of the electrodes being set to the above-mentioned values, thereby lowering the fabrication costs of SAW equipment units of a small capacity ratio such as SAW resonators, SAW filters, SAW oscillators, and SAW correlators.

The above and other objects, features and advantages of the present invention will become more apparent from the accompanying drawings, in which like reference numerals are used to identify the same or similar parts in several views.

DETAILED DESCRIPTION OF PREFERRED EMBODIMENTS

Before describing preferred embodiments of the invention, principles of characteristics improvement by a SAW transducer according to the invention will be explained.

Capacity ratio γ of the transducer for a surface acoustic wave (SAW) resonator is expressed as $\gamma = 1/\{(fa/fr)^2 - 1\}$, where fr denotes resonant frequency and fa denotes antiresonant frequency. When a matter having a large inertial mass exists on a surface of a piezoelectric material, a propagation velocity of a surface acoustic wave decreases. Based on this phenomenon, the capacity ratio is lowered by lowering the resonant and antiresonant frequencies. Hence, for the metal electrode material of transducers, Au has been used, which is large in inertial mass, or large in density.

Figure 1:
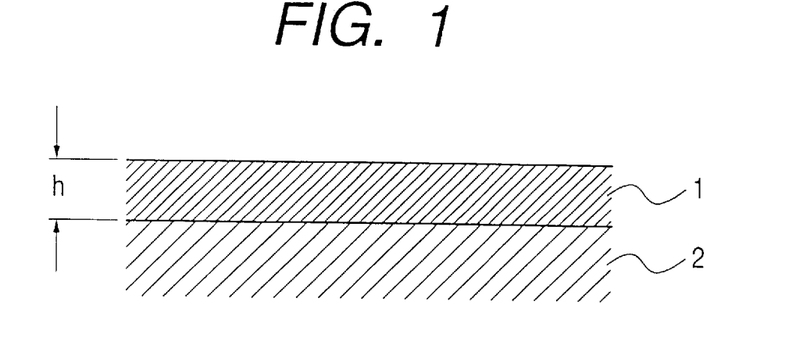
FIG. 1 is a diagram illustrating a model of a SAW-velocity simulator.

For the development of SAW resonators using Au for their electrodes, the SAW-velocity simulator proposed by Campbell et al. has been used. This SAW-velocity simulator, however, cannot calculate the resonant and antiresonant frequencies directly. FIG. 1 shows a model of this SAW-velocity simulator. As shown, a metal film 1 having a film thickness h exists on a piezoelectric substrate 2. From two types (Love-wave type SAW and Rayleigh wave) of propagation velocities Vm1 and Vm2 obtained when the boundary between the piezoelectric substrate 2 and the metal film 1 is electrically short-circuited and two types of propagation velocities Vo1 and Vo2 obtained when the boundary is electrically opened, resonant frequencies fr1=Vm1/P and fr2=Vm2/P and antiresonant frequencies fa1=Vo1/P and fa2=Vo2/P are approximately provided, where P stands for electrode pitch.

Figure 2:
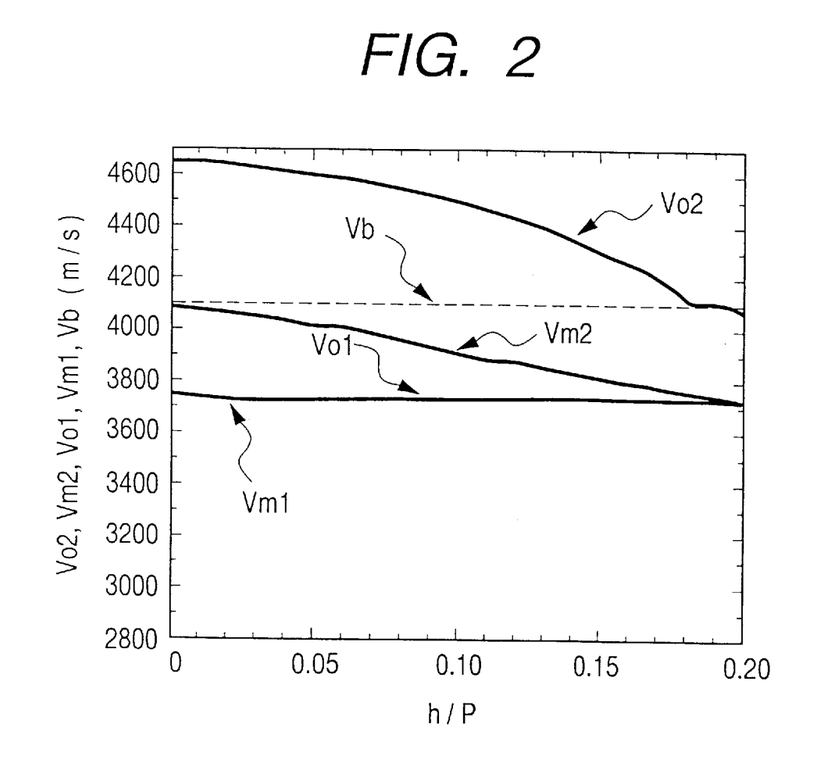
FIG. 2 is a diagram depicting a relations between h/P and propagation velocities of surface acoustic waves in a Y-cut lithium niobate single crystal piezoelectric substrate, as calculated by the SAW-velocity simulator.

In Au 2%/YX-LN, the above-mentioned values obtained by the SAW-velocity simulator well matched those obtained by experiments (for example, the experiment values were obtained from the 20th Wave Device And Frequency Control Symposium Draft, 1991, pp. 115–120 and the simulated values were obtained from the Research Report US 86-37, Association of Electronic Communications, pp. 31–38). However, in a SAW resonator using an Al metal film for electrodes, the experiment values do not match the results of the simulation. FIG. 2 shows the relation between the propagation velocity obtained by the simulation and the electrode pitch P when the Al metal film is used for electrodes.

Figure 3:
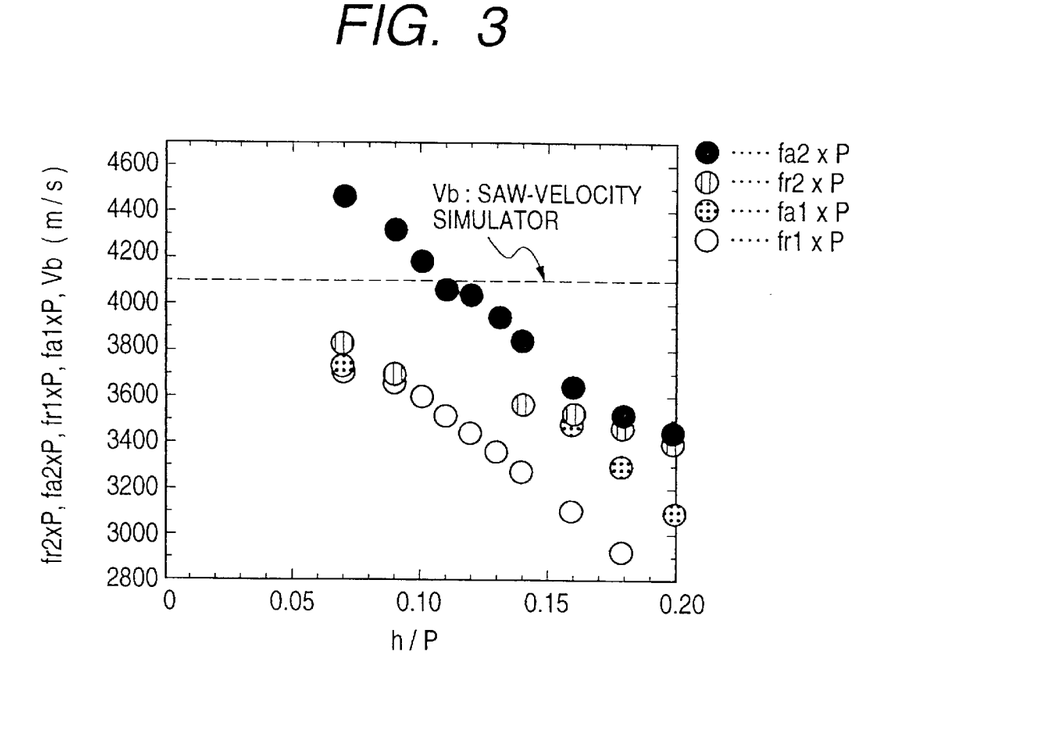
FIG. 3 is a diagram depicting experiment results indicating relations between resonant frequency fr and antiresonant frequency fa of a θ one-port resonator and Al electrode film thickness h with θ=0 degree in a one-port resonator based on a Y-cut lithium niobate single crystal with an Al metal film used as electrodes.

FIG. 3 shows the relations obtained by experiments between resonant frequency fr and antiresonant frequency fa and Al electrode film thickness h and electrode pitch P of a one-port resonator in a SAW resonator transducer using a Y cut lithium niobate single crystal for the piezoelectric substrate with an Al metal film of cut angle θ=0 used as electrodes. The vertical and lateral axes are the same as those of FIG. 2. The vertical axis indicates the product of resonant frequency fr or antiresonant frequency fa and electrode pitch P and has propagation velocity dimension (m/s). The lateral axis indicates ratio h/P of Al electrode film thickness h and electrode pitch P. In the figure, Vb denotes the propagation velocity of the elastic wave unique to Y cut lithium niobate, a piezoelectric matter obtained by the simulation.

Figure 6A:
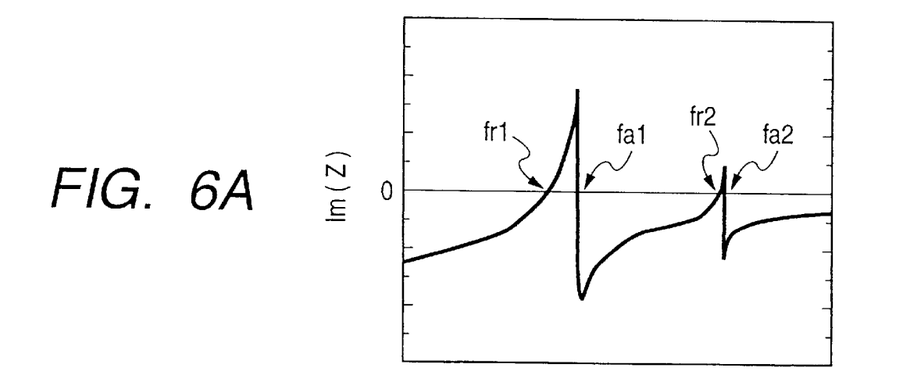
FIGS. 6A and 6B are diagrams indicating frequency characteristics of complex component of impedance of the SAW transducer.
Figure 6B:
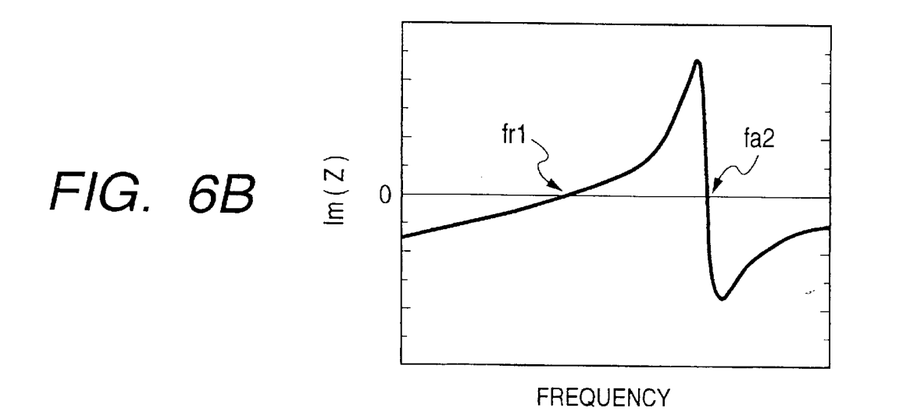

As seen from the figure, depending on electrode film thickness h, there are an h/P range in which two resonant frequencies fr and two antiresonant frequencies fa (fr1 and fr2, fa1 and fa2) exist and an h/P range in which substantially one resonant frequency fr and one antiresonant frequency exist. Because two types of surface acoustic waves (Love-wave type SAW and Rayleigh wave) are oscillated, the frequency characteristics of these ranges present two resonance characteristics. The resonance of Rayleigh wave, which is a spurious resonance, is fr1 and fa1 at h/P=0.07 and fr2 and fa2 at h/P=0.16 to 0.20. At h/P=0.09 to 0.14, Love-wave type SAW and Rayleigh wave are mixed. Especially, at h/P=0.10 to 0.13, the mixture is heavy, so that fa1 and fr2 are lost. Because fa1 and fr2 are lost, the resonance characteristics of one resonant frequency and one antiresonant frequency, namely the resonant characteristics having no spurious resonance are realized. FIGS. 6A and 6B each show frequency characteristic of complex component Im (Z) of impedance of the transducer for the SAW resonator at each of h/P=0.16 to 0.20 and h/P=0.10 to 0.13.

The characteristic shown in FIG. 3 is obviously different from that in FIG. 2. It has been held that resonance characteristic having no spurious resonance appears only when a high-density material such as Au is used for electrode material. However, it was proved that the similar phenomenon appears even if Al, which is small in density, is used for electrode material when h/P is within a specific range (0.09 to 0.14). Namely, when cut angle θ is 0 and $0.09 \leq h/P \leq 0.14$, the resonator having no spurious resonance is implemented.

Figure 4:
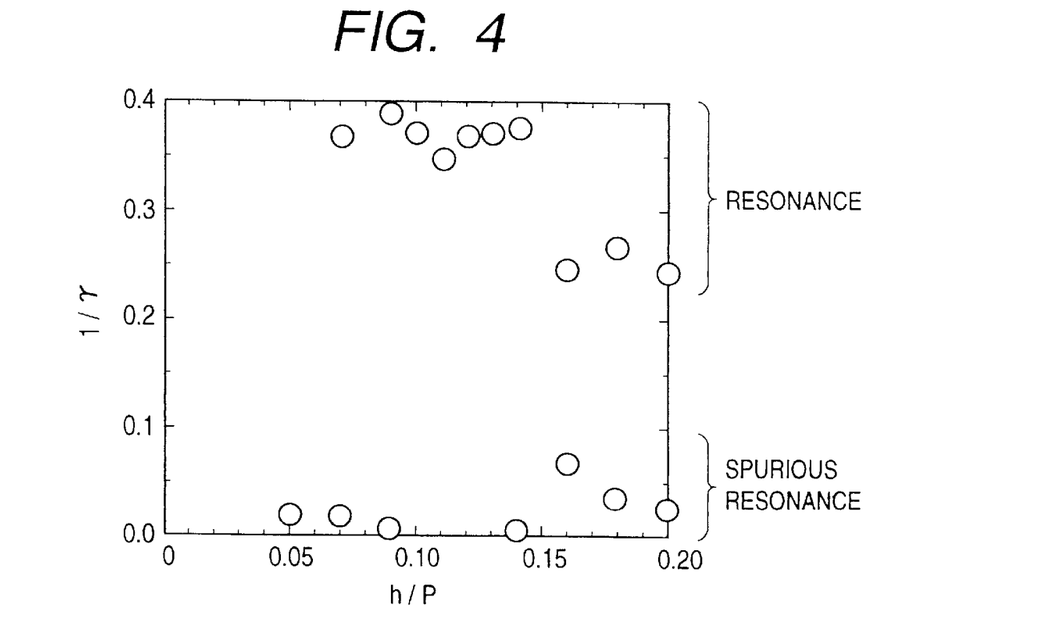
FIG. 4 is a diagram depicting film thickness dependency of capacity ratio γ of a SAW resonator using a Y-cut lithium niobate single crystal with the Al metal film used as electrodes, calculated from fr and fa of FIG. 3.

Further, FIG. 4 shows a relation between capacity ratio γ and h/P of a SAW resonator using a Y cut lithium niobate single crystal with Al metal film calculated from fr and fa of FIG. 3 used as electrodes. The lateral axis indicates h/P while the vertical axis indicates 1/γ. As seen from the figure, capacity ratio γ presents the smallest value when h/P=0.09. When 0.14<h/P, γ deteriorates quickly due to spurious resonance. In a range of $0.07 \leq h/P \leq 0.14$, capacity ratio γ drops below 3.

Figure 5:
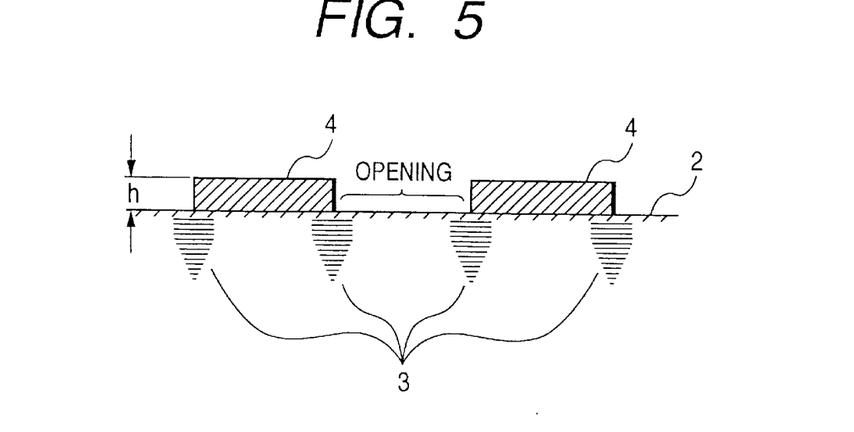
FIG. 5 is a partial cross section of a SAW transducer for describing the action of the present invention.

The phenomenon obtained by the experiment results is based on the following principle. In a transducer for a SAW resonator provided with an electrode finger 4 on the surface of the piezoelectric substrate 2 as shown in FIG. 5, the form of surface acoustic wave propagation is completely different between an electrode finger opening and the electrode finger 4. At an electrode finger edge 3, which is a boundary between the electrode finger opening and the electrode finger, a trap of surface acoustic wave occurs due to a mismatch in the surface acoustic wave propagation form. The trap of surface acoustic wave is affected by the thickness h of the electrode finger 4, decreasing the propagation velocity of surface acoustic wave. As a result, the ratio (fa/fr) of resonant frequency fr and antiresonant frequency fa increases within a specific range of h/P.

Based on the above-mentioned principle, a SAW resonator having various θ and h/P associated with the trap was fabricated, which is a one-port resonator having interdigital transducer structure with the number of pairs of 50 and an aperture of 30P, the one-port resonator using Al for the metal electrode material and a Y cut lithium niobate single crystal for the piezoelectric material, in which the electrodes are directed in parallel to the X-axis of the Y cut lithium niobate single crystal. Using this SAW resonator, relations between θ and h/P and surface acoustic wave trap, resonance characteristics (resonant frequency fr, antiresonant frequency fa, and Q value), and the decrease in capacity ratio.

The following resonators were fabricated: θ=−30, −20, −10, 0, 10, 20, and 30; h/P=0.07, 0.09, 0.10, 0.11, 0.12, 0.13, 0.14, 0.16, and 0.18 (electrode film thickness h=0.18 μm and electrode pitch P=10.3, 11.6, 13.2, 14.2, 15.4, 16.8, 18.5, 20.6, and 26.4 μm).

Consequently, when $-30 \leq \theta \leq 20$ and $h/P \geq 0.07$, a decrease in the resonant frequency fr and the antiresonant frequency fa due to the trap of surface acoustic wave was confirmed by the experiment.

Further, no spurious resonance occurred on the following SAW resonators:
when θ=−30, h/P=0.11;
when θ=−20, $0.10 \leq h/P \leq 0.11$;
when θ=−10, $0.09 \leq h/P \leq 0.12$;
when θ=0, $0.09 \leq h/P \leq 0.14$;
when θ=10, $0.10 \leq h/P \leq 0.14$; and
when θ=20, $0.12 \leq h/P \leq 0.16$.

Thus, if an Al interdigital transducer is formed on the surface of θ rotated Y cut lithium niobate signal crystal piezoelectric substrate in parallel to the X-axis of the lithium niobate crystal, a resonator that will generate no spurious resonance can be fabricated when $$(\theta+5)^2/300+11/12 \leq h/P \times 100-8 \leq -0.0001 \times (\theta+5)^3 + 0.1625 \times (\theta+5) + 5.5$$

and $$-30 \leq \theta \leq 20 \quad (1)$$

Next, resonant Q and antiresonant Q, the most basic elements of the resonance characteristics were examined. In a SAW resonator using a Y cut lithium niobate single crystal with an Al metal film used as electrodes, on the frequency side higher than the resonant frequency Vb/P of a slow transversal wave (bulk wave), the energy of surface acoustic wave is lost into the bulk wave, thereby decreasing the Q value. Hence, to increase the Q value, it is required to make fr<fb for resonant Q and fa<fb for antiresonant Q and make the resonant frequency fr and antiresonant frequency fa of surface acoustic wave smaller than the resonant frequency fb=Vb/P of the bulk wave. Comparison of fr, fa and fb of the fabricated SAW resonators indicated that the resonant frequency fr is smaller than fb throughout the resonators. Antiresonant frequency fa was found smaller than fb in the following resonators:
when θ=−30, $0.09 \leq h/P$;
when θ=−20, $0.10 \leq h/P$;
when θ=−10, $0.11 \leq h/P$;
when θ=0, $0.11 \leq h/P$;
when θ=10, $0.11 \leq h/P$;
when θ=20, $0.11 \leq h/P$; and
when θ=30, $0.11 \leq h/P$.

Thus, if an Al interdigital transducer is formed on the surface of a θ rotated Y cut lithium niobate single crystal piezoelectric substrate in parallel to the X-axis of the lithium niobate crystal, a resonator having excellent resonant Q and antiresonant Q can be fabricated when:

$$0.001 \times \theta + 0.12 \leq h/P$$

and $$-30 \leq \theta < -10$$

or $$0.11 \leq h/P$$

and $$-10 \leq \theta \leq 30 \quad (2)$$

Next, capacity ratio γ, an important element among resonance characteristics was examined. As a result, capacity ratio γ was found below 3 in the following devices:

when θ=−20, 0.11≦h/P≦0.14;
when θ=−10, 0.07≦h/P≦0.14;
when θ=0, 0.07≦h/P≦0.14;
when θ=10, 0.07≦h/P≦0.18; and
when θ=20, 0.07≦h/P≦0.16.

Thus, if an Al interdigital transducer is formed on the surface of a θ rotated Y cut lithium niobate single crystal piezoelectric substrate in parallel to the X-axis of the lithium niobate crystal, a resonator having excellent capacity ratio γ can be fabricated when:

$$-0.005 \times \theta + 0.07 \leq h/P \leq -0.004 \times \theta + 0.18$$

and $$-10 \leq \theta \leq 20$$

and $$0.07 \leq h/P \leq 0.14 \quad (3)$$

The same results were obtained when other number of electrode pairs and apertures were used. Consequently, fabricating the SAW transducer under the condition of (1), (2) or (3) above can manufacture, at a low cost, SAW equipment having no spurious resonance or having large resonant and antiresonant Q values or having excellent capacity ratio.

Further, fabricating, by using the above-mentioned transducer, SAW equipment such as SAW resonator, SAW filter, SAW oscillator, and SAW correlator can implement less costly SAW equipment having no spurious resonance or having large Q values or having a wide bandwidth.

PREFERRED EMBODIMENT 1

Figure 7:
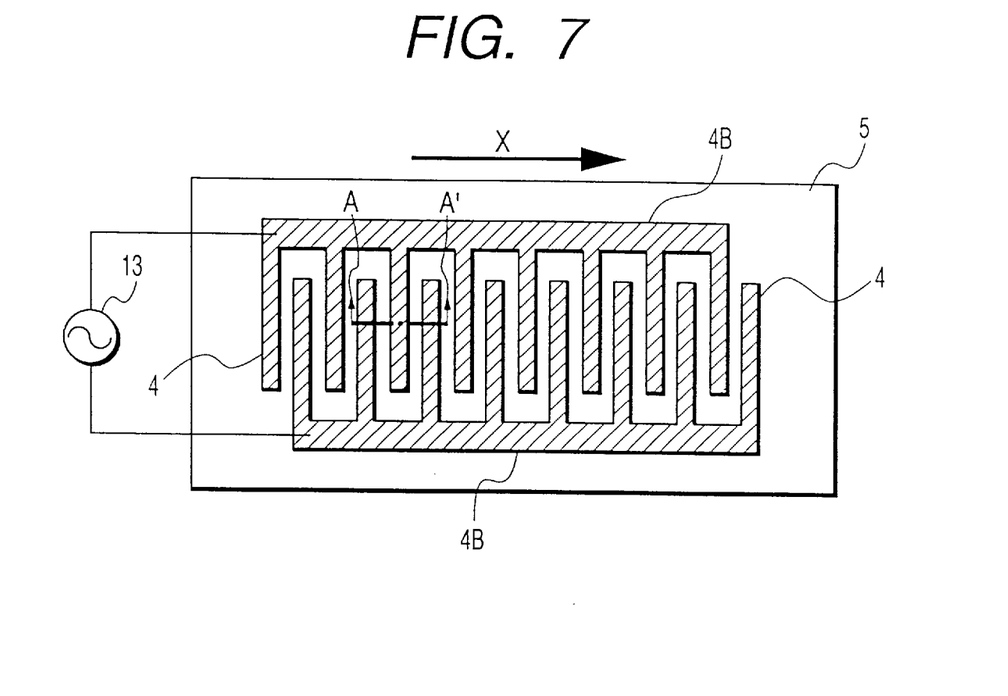
FIG. 7 is a top view of one embodiment of the SAW transducer according to the present invention.
Figure 8:
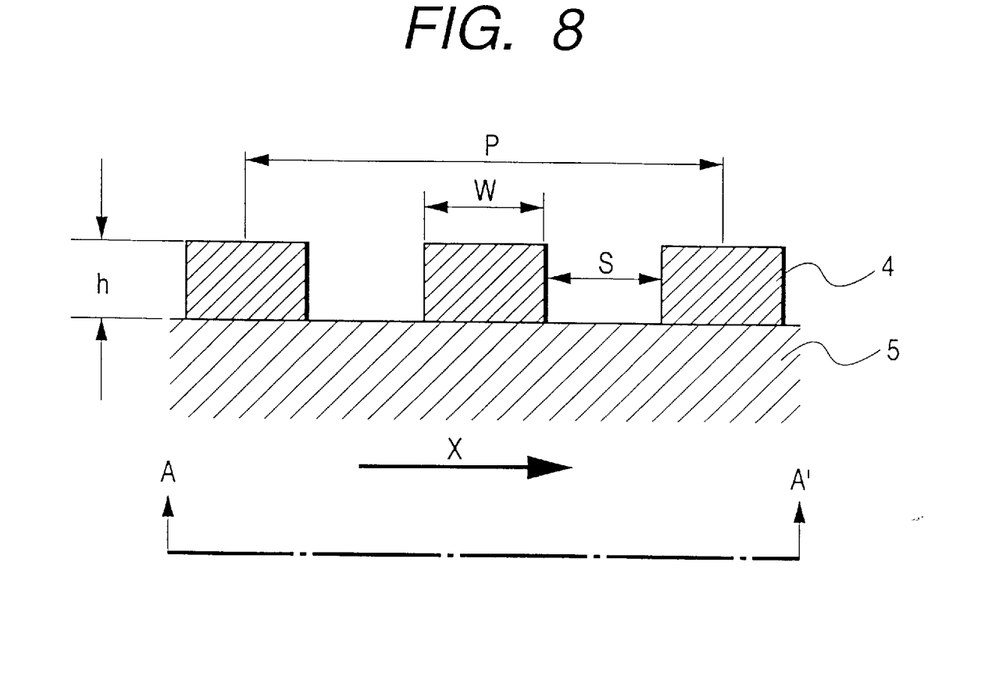
FIG. 8 is a cross section of the SAW transducer of FIG. 7 along line A–A'.

FIG. 7 shows a top view of the SAW transducer according to one preferred embodiment of the invention. FIG. 8 shows a cross section of the embodiment of FIG. 7 along line A–A'. In this embodiment, interdigital transducers (4B, 4) arranged with an electrode pitch P=1.85 μm are formed on the surface of a piezoelectric substrate 5 of a Y cut lithium niobate single crystal with an Al metal film abraded flat used as electrodes, in parallel to the X-axis of the lithium niobate single crystal, the metal film being mainly composed of Al (Al 98%, Cu 2%) with a film thickness h. Here, −30≦θ≦20, 0.07≦h/P≦0.18. The interdigital transducer has many electrode fingers 4 arranged at right angles to the electrode direction and two bus bars 4B alternating connecting these electrode fingers 4. Ratio of the width w of each electrode finger 4 and the interval s between the electrode fingers is generally one to one. When a high-frequency electrical signal 13 is applied between the two bus bars 4B, a surface acoustic wave is oscillated on the surface of the piezoelectric substrate 2 with the wave number vector being the X-axis or −X-axis of the lithium niobate single crystal and the pitch P of the interdigital transducer 4 being the approximate wavelength.

Figure 9:
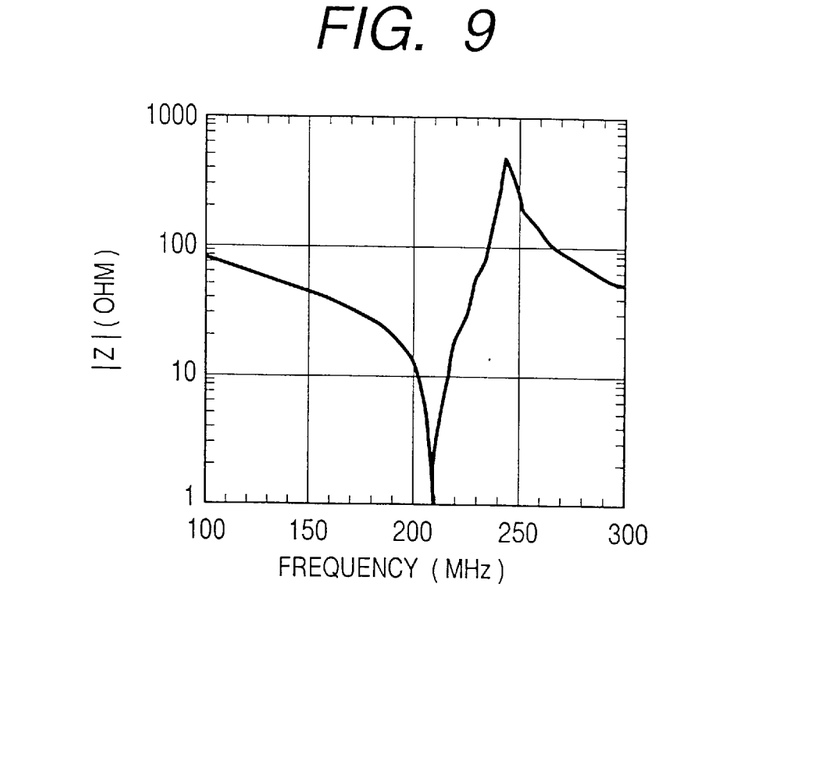
FIG. 9 is a diagram indicating the impedance characteristic of one embodiment of a one-port resonator using the SAW transducer according to the present invention.

FIG. 9 shows the frequency characteristic of the impedance obtained by measuring by 50-ohm system a one-port resonator fabricated by the SAW transducer according to the invention, the one-port resonator being practiced as one preferred embodiment thereof. In the figure, the vertical axis indicates the absolute value |Z| (ohm) of the impedance, while the lateral axis indicates the frequency. The Y cut lithium niobate single crystal substrate with Al metal film used as the electrodes according to the present embodiment is θ=0 degrees (Y cut) and h/P=0.11. Resonant frequency fr was 208.68 MHz and antiresonant frequency fa was 241.8 MHz. It should be noted that resonant frequency fr and antiresonant frequency fa are frequencies in which the complex component (hereinafter referred to as Im(Z)) of impedance is zero; to be more specific, for resonant frequency fr, Im(Z) becomes zero from the negative (−) side and, for antiresonant frequency fa, Im(Z) becomes zero from the positive (+) side. The Q values of resonant and antiresonant frequencies are large and no spurious resonance occurred. Capacity ratio γ is defined as follows:

$$\gamma = 1/\{(fa/fr)^2 - 1\}$$

so that, according to the present embodiment, although Al is used for the electrode material, the SAW resonator having excellent Q values, no spurious resonance, and extremely low capacity ratio of γ=2.92 was realized.

Figure 10:
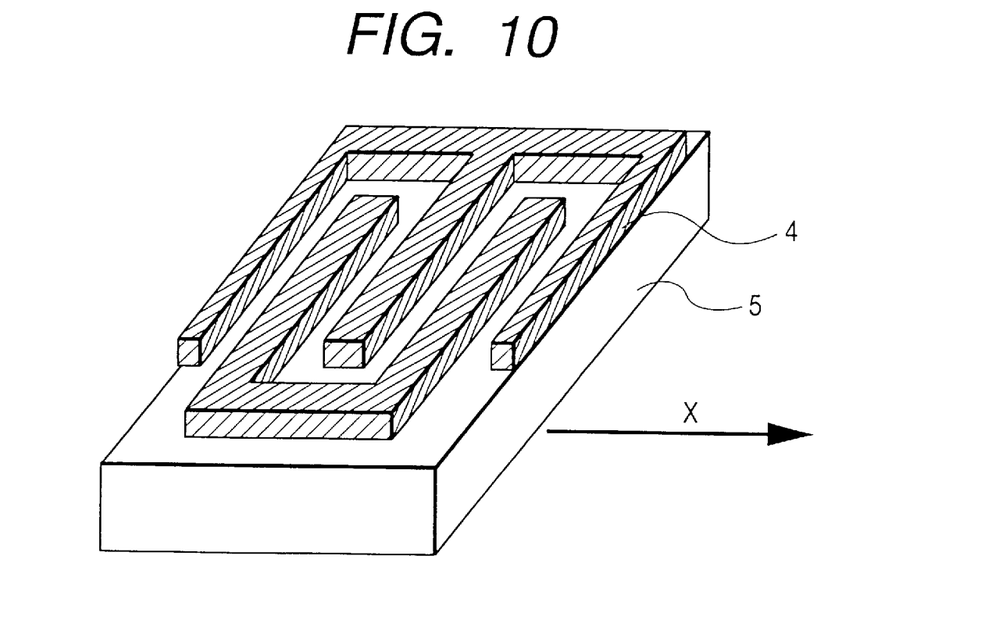
FIG. 10 is a perspective view of another embodiment of a free-edge reflection type SAW resonator.

FIG. 10 is a perspective view of a free-edge reflection type SAW resonator practiced as one preferred embodiment of the invention. In this embodiment, an interdigital transducer 4 composed mainly of Al and having several pairs of electrode fingers is formed on the surface of a θ rotated Y cut lithium niobate single crystal piezoelectric substrate in parallel to the X-axis of the lithium niobate single crystal. θ and h/P are set to one of the above-mentioned conditions respectively. To efficiently contain the surface acoustic wave, the electrode fingers on both ends of the electrode are cut to the length which is a half of the width of the finger. According to this embodiment, the free-edge reflection type SAW resonator can reduce the number of electrode fingers, thereby further reducing the fabrication cost.

Figure 11:
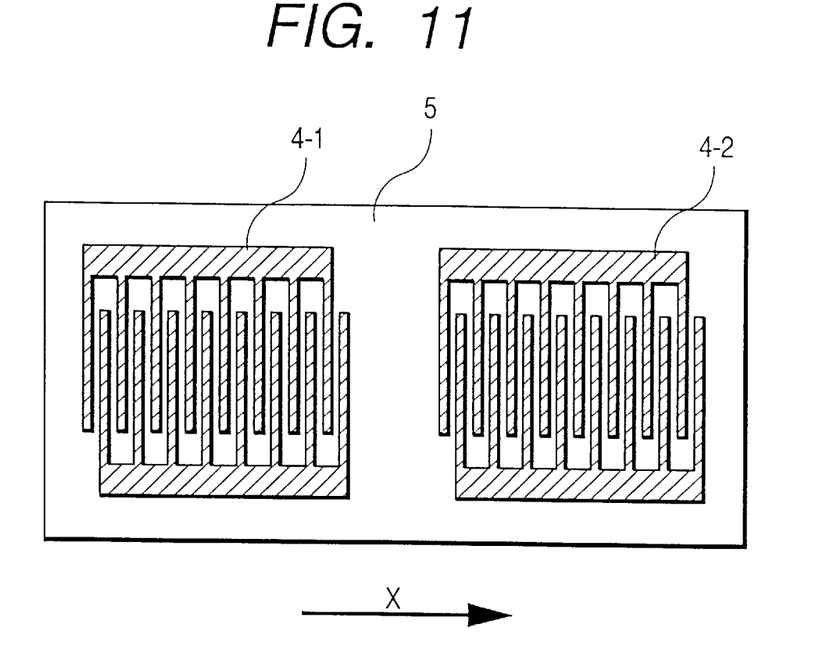
FIG. 11 is a top view of one embodiment of a two-port resonator according to the present invention.

FIG. 11 shows a top view of the SAW transducer practiced as another preferred embodiment of the invention. In this embodiment, the SAW transducer of FIG. 10 is arrange in two units, providing a two-port resonator. In constitution, an interdigital transducer 4 composed mainly of Al and having several pairs of electrode fingers is formed on a θ rotated Y cut lithium niobate single crystal piezoelectric substrate 5 in parallel to the X-axis of the lithium niobate single crystal. A symbol θ and h/P are set to one of the above-mentioned conditions respectively. The relative positional relationship between the two transducers is parallel to the X-axis of the lithium niobate single crystal. On one transducer 4-1, an electrical signal is converted to a surface acoustic wave; on the other transducer 4-2, a surface acoustic wave is converted to an electrical signal. According to this embodiment, use of two transducers using low-cost Al as the electrode material can implement a low-cost two-port resonator having low loss or high Q values or no spurious resonance. In addition, use of this embodiment as a pass-type filter provides a low-cost filter having a small loss at passing frequency.

Figure 12:
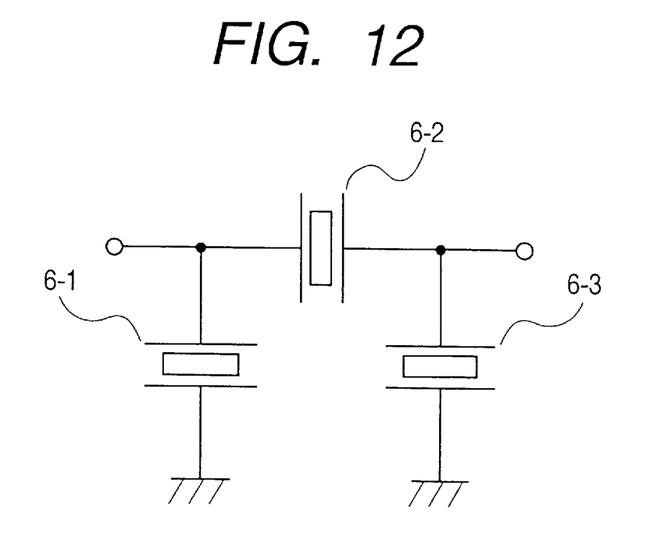
FIG. 12 is a circuit diagram of one embodiment of a filter using a plurality of SAW resonators according to the present invention.

FIG. 12 shows a circuit diagram of a filter using a plurality of SAW resonator according to the present invention, the filter being practiced as another preferred embodiment thereof. In this embodiment, a filter is constituted by three SAW resonators 6-1, 6-2 and 6-3, each of which is composed of 0-degree rotated Y cut lithium niobate single crystal piezoelectric substrate and an interdigital transducer composed of Al metal thin film formed on the substrate. The number of electrode pairs is 50 and the aperture is 30P. The interdigital transducer is arranged in the direction of the X-axis of the lithium niobate single crystal. The electrode pitch P of the two SAW resonators 6-1 and 6-3 interconnected in parallel is 14.2 μm. The thickness h of their Al metal thin film is 1.6 μm. The electrode pitch P of the SAW resonator 6-2 connected to the other two in series is 16.8 μm. The thickness h of its Al metal thin film is 1.85 μm. A bandpass filter is constituted by matching the antiresonant frequency of the parallel-connected SAW resonators 6-1 and 6-3 with the resonant frequency of the SAW resonator 6-2 and using a resultant frequency as the passing frequency and using the resonant frequency of the parallel-connected resonators 6-1 and 6-3 and the antiresonant frequency of the series-connected resonator 6-2 as the blocking frequency. According to this embodiment, use of a plurality of SAW resonators using low-cost Al as the electrode material can implement a low-cost filter having a wide band, high Q values, and no spurious resonance.

Figure 13:
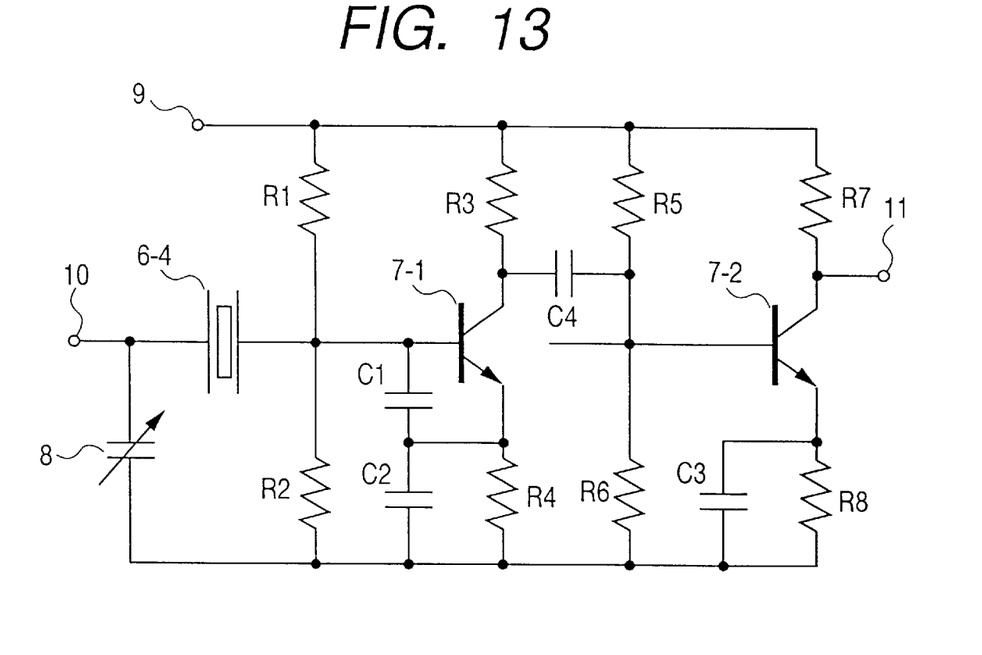
FIG. 13 is a circuit diagram of one embodiment of a Colpitts type surface acoustic wave voltage controlled oscillator using the SAW resonator according to the present invention.

FIG. 13 shows a circuit diagram of a Colpitts type SAW voltage controlled oscillator using the SAW resonator according to the invention, the oscillator being practiced as one preferred embodiment thereof. In this oscillation circuit, capacities C1 and C2 and a SAW resonator 6-4 are used to rotate the phase of a feedback signal by 180 degrees. To vary oscillation frequency, a variable capacity 8 is connected in series with the SAW resonator 6-4. Resistors R1, R2, R5 and R6 determine the base potential of transistors 7-1 and 7-2. Resistors R3 and R7 are output resistors. A capacity C4 is connected to separate the transistors 7-1 and 7-2 in direct current manner. A capacity C3 is connected to increase output.

The SAW resonator 6-4 is constituted by a 0-degree rotated Y cut lithium niobate single crystal piezoelectric substrate and an interdigital transducer composed of an Al metal thin film formed on the substrate. The number of electrode pairs is 50. The aperture is 30P. The interdigital transducer is arranged in the direction of the X-axis of the lithium niobate single crystal. The electrode pitch P is 16.8 µm. The thickness h of the Al metal thin film is 1.85 µm. According to this embodiment, use of a SAW resonator using low-cost Al for the electrode material can implement a low-cost SAW voltage controlled oscillator having a broad band, high Q values or no spurious resonance.

Figure 14:
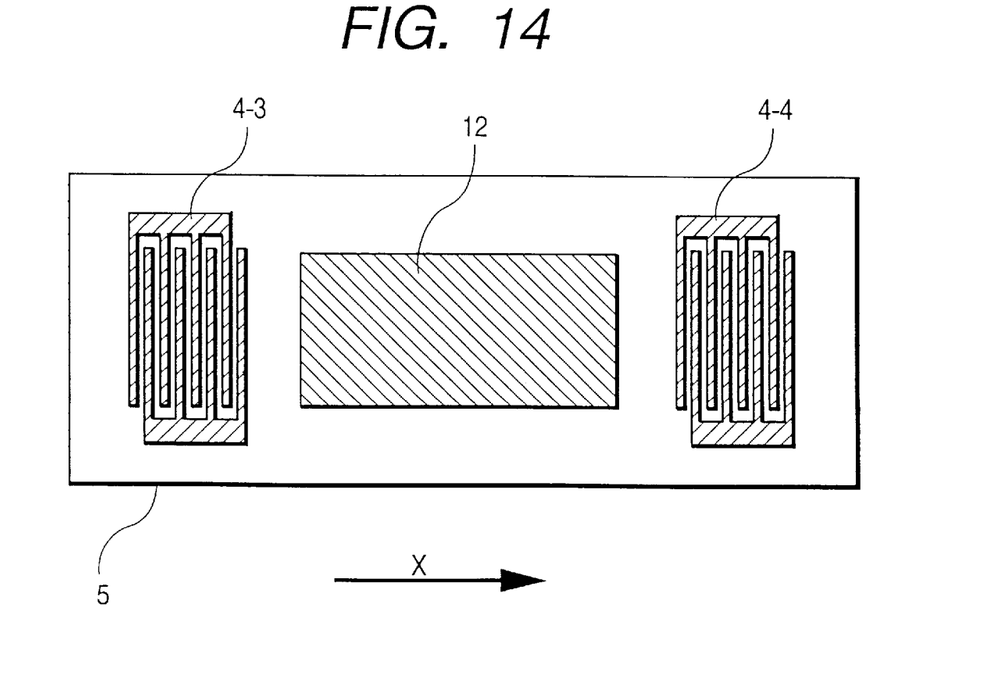
FIG. 14 is a top view of one embodiment of a SAW correlator according to the present invention.

FIG. 14 shows a top view of a SAW correlator according to the invention, practiced as one preferred embodiment thereof. In this embodiment, a gallium arsenide compound film 12 is formed as a semiconductor film on the surface of a lithium niobate single crystal piezoelectric substrate 5 between two SAW transducers 4-3 and 4-4. Each of these SAW transducers uses the above-mentioned SAW transducer. An output signal is obtained from a metal film formed on the surface of the semiconductor film 12. The electric field generated by the surface acoustic wave oscillated by the SAW transducers 4-3 and 4-4 also penetrates in the semiconductor film. According to electrical nonlinearity of the semiconductor film, a correlation signal of two surface acoustic waves is outputted. According to this embodiment, use of low-cost Al as the electrode material and use of the SAW resonator having small capacity ratio can implement a low-cost SAW correlator having a low loss, a high BT product, high Q values or no spurious resonance.

Some SAW correlators use a bulk semiconductor. In this case, the bulk semiconductor is mounted on the surface of the lithium niobate single crystal or mounted thereon with a gap in between. Alternatively, instead of using the semiconductor, elastic nonlinearity of the lithium niobate single crystal is used. In any case, applying the present invention to the transducer can provide a SAW correlator having the above-mentioned performance. Further, use of the above-mentioned resonator, filter, oscillator, and correlator on radio communication device terminals can lower the cost of the same.

While the preferred embodiments of the present invention have been described using specific terms, such description is for illustrative purposes only, and it is to be understood that changes and variations may be made without departing from the spirit or scope of the appended claims. For example, since the trap of a surface acoustic wave at the edge of an electrode finger is used in the invention, the same is obviously effective also for transducers of which ratio of electrode finger width and a gap between electrode fingers is other than one to one. The constitution of interdigital transducer fingers may also be those which are weighted by decimation or apodization. Further, the electrode material may be Al and silicon dioxide or the like formed on the same, the silicon dioxide or the like having a density approximately similar to that of Al. In a device using surface acoustic wave, θ rotated Y cut and θ+180-degree rotated Y cut are entirely equivalent owning to the symmetry of the crystal of the piezoelectric substrate. Hence, it is apparent that the present invention remains the same if θ is replaced with θ+180.

In addition, applying the above-mentioned alterations associated with the invention may also lower the fabrication cost of radio communication devices.

What is claimed is:

1. A surface acoustic wave transducer having an interdigital transducer mounted on a surface of a θ rotated Y cut lithium niobate single crystal piezoelectric substrate, wherein a principal ingredient of said interdigital transducer is aluminum, the direction of said interdigital transducer is parallel to the X-axis of the lithium niobate single crystal, and a cut angle θ of said piezoelectric substrate, a film thickness h of electrode fingers of said interdigital transducer and a pitch P of said electrode fingers have the following relationship:

$$(θ+5)^2/300+11/12 \leq h/P \times 100-8 \leq -0.0001 \times (θ+5)^3 + 0.1625 \times (θ+5) + 5.5$$

and $$-30 \leq θ \leq 20.$$

2. A surface acoustic wave transducer having an interdigital transducer mounted on a surface of a θ rotated Y cut lithium niobate single crystal piezoelectric substrate, wherein a principal ingredient of said interdigital transducer is aluminum, the direction of said interdigital transducer is parallel to the X-axis of the lithium niobate single crystal, and a cut angle θ of said piezoelectric substrate, a film thickness h of electrode fingers of said interdigital transducer, and a pitch P of said electrode fingers have the following relationship:

$$0.001 \times θ + 0.12 \leq h/P$$

and $$-30 \leq θ < -10$$

or $$0.11 \leq h/P$$

and $$-10 \leq θ \leq 30.$$

3. A surface acoustic wave transducer having an interdigital transducer mounted on a surface of a θ rotated Y cut lithium niobate single crystal piezoelectric substrate, wherein a principal ingredient of said interdigital transducer is aluminum, the direction of said interdigital transducer is parallel to the X-axis of the lithium niobate single crystal, and a cut angle θ of said piezoelectric substrate, a film thickness h of electrode fingers of said interdigital transducer, and a pitch P of said electrode fingers have the following relationship:

$$-0.005 \times \theta + 0.07 \leq h/P \leq -0.004 \times \theta + 0.18$$

and $$-10 \leq \theta < 20$$

and $$0.07 \leq h/P \leq 0.14.$$

4. A surface acoustic wave resonator having at least one surface acoustic wave transducer, wherein said surface acoustic wave transducer is a surface acoustic wave transducer having an interdigital transducer mounted on a surface of a θ rotated Y cut lithium niobate single crystal piezoelectric substrate, the direction of said interdigital transducer is parallel to the X-axis of the lithium niobate single crystal and a principal ingredient of said interdigital transducer is aluminum, and a cut angle θ of said piezoelectric substrate, a film thickness h of electrode fingers of said interdigital transducer, and a pitch P of said electrode fingers have the following relationship:

$$(\theta+5)^2/300 + 11/12 \leq h/P \times 100 - 8 \leq -0.0001 \times (\theta+5)^3 + 0.1625 \times (\theta+5) + 5.5$$

and $$-30 \leq \theta \leq 20.$$

5. A surface acoustic wave resonator having at least one surface acoustic wave transducer, wherein said surface acoustic wave transducer is a surface acoustic wave transducer having an interdigital transducer mounted on a surface of a θ rotated Y cut lithium niobate single crystal piezoelectric substrate, the direction of said interdigital transducer is parallel to the X-axis of the lithium niobate single crystal and a principal ingredient of said interdigital transducer is aluminum, and a cut angle θ of said piezoelectric substrate, a film thickness h of electrode fingers of said interdigital transducer, and a pitch P of said electrode fingers have the following relationship:

$$0.001 \times \theta + 0.12 \leq h/P$$

and $$-30 \leq \theta < -10$$

or $$0.11 \leq h/P$$

and $$-10 \leq \theta \leq 30.$$

6. A surface acoustic wave resonator having at least one surface acoustic wave transducer, wherein said surface acoustic wave transducer is a surface acoustic wave transducer having an interdigital transducer mounted on a surface of a θ rotated Y cut lithium niobate single crystal piezoelectric substrate, the direction of said interdigital transducer is parallel to the X-axis of the lithium niobate single crystal and a principal ingredient of said interdigital transducer is aluminum, and a cut angle θ of said piezoelectric substrate, a film thickness h of electrode fingers of said interdigital transducer, and a pitch P of said electrode fingers have the following relationship:

$$-0.005 \times \theta + 0.07 \leq h/P \leq -0.004 \times \theta + 0.18$$

and $$-10 \leq \theta < 20$$

and $$0.07 \leq h/P \leq 0.14.$$

7. A surface acoustic wave filter formed with a plurality of surface acoustic wave transducers on a surface abraded flat of a piezoelectric material, wherein the relative position of at least two of said plurality of surface acoustic wave transducers is parallel to the X-axis of a lithium niobate single crystal and said at least two transducers are surface acoustic wave transducers having an interdigital transducer mounted on a surface of a θ rotated Y cut lithium niobate single crystal piezoelectric substrate and a principal ingredient of said interdigital transducer is aluminum, and a cut angle θ of said piezoelectric substrate, a film thickness h of electrode fingers of said interdigital transducer, and a pitch P of said electrode fingers have the following relationship:

$$(\theta+5)^2/300 + 11/12 \leq h/P \times 100 - 8 \leq -0.0001 \times (\theta+5)^3 + 0.1625 \times (\theta+5) + 5.5$$

and $$-30 \leq \theta \leq 20.$$

8. A surface acoustic wave filter formed with a plurality of surface acoustic wave transducers on a surface abraded flat of a piezoelectric material, wherein the relative position of at least two of said plurality of surface acoustic wave transducers is parallel to the X-axis of a lithium niobate single crystal and said at least two transducers are surface acoustic wave transducers having an interdigital transducer mounted on a surface of a θ rotated Y cut lithium niobate single crystal piezoelectric substrate and a principal ingredient of said interdigital transducer is aluminum, and a cut angle θ of said piezoelectric substrate, a film thickness h of electrode fingers of said interdigital transducer, and a pitch P of said electrode fingers have the following relationship:

$$0.001 \times \theta + 0.12 \leq h/P$$

and $$-30 \leq \theta < -10$$

or $$0.11 \leq h/P$$

and $$-10 \leq \theta \leq 30.$$

9. A surface acoustic wave filter formed with a plurality of surface acoustic wave transducers on a surface abraded flat of a piezoelectric material, wherein the relative position of at least two of said plurality of surface acoustic wave transducers is parallel to the X-axis of a lithium niobate single crystal and said at least two transducers are surface acoustic wave transducers having an interdigital transducer mounted on a surface of a θ rotated Y cut lithium niobate single crystal piezoelectric substrate and a principal ingredient of said interdigital transducer is aluminum, and a cut angle θ of said piezoelectric substrate, a film thickness h of electrode fingers of said interdigital transducer, and a pitch P of said electrode fingers have the following relationship:

$$-0.005 \times \theta + 0.07 \leq h/P \leq -0.004 \leq \times \theta + 0.18$$

and $$-10 \leq \theta < 20$$

and $$0.07 \leq h/P \leq 0.14.$$

10. A surface acoustic wave correlator formed with a plurality of surface acoustic wave transducers on at least one surface abraded flat of a piezoelectric material, wherein at least one of said plurality of surface acoustic wave transducers is surface acoustic wave equipment formed with an interdigital transducer on said at least one surface abraded flat and a film thickness of said interdigital transducer and a pitch of electrode fingers of said interdigital transducer are determined so that the relationship in magnitude of a propagation velocity of a surface acoustic wave generated by said interdigital transducer and a propagation velocity of an elastic wave having a propagation vector in the same direction as that of said surface acoustic wave, said elastic wave being a non-surface wave, having a propagation velocity unique to piezoelectric material, and being independent of shapes of said interdigital transducer and said piezoelectric material is inverted to make the propagation velocity of said surface acoustic wave lower than the propagation velocity of said non-surface wave.

11. A surface acoustic wave correlator according to claim 10, wherein said piezoelectric material is a θ rotated Y cut lithium niobate single crystal piezoelectric substrate and said interdigital transducer is a metal thin film of which principal ingredient is aluminum.

12. A surface acoustic wave correlator according to claim 11, wherein the direction of said interdigital transducer is parallel to the X-axis of said θ rotated Y cut lithium niobate single crystal, the principal ingredient of said interdigital transducer is aluminum, and a cut angle θ of said piezoelectric substrate, a film thickness h of electrode fingers of said interdigital transducer, and a pitch P of said electrode fingers have the following relationship:

$$(\theta+5)^2/300 + 11/12 \leq h/P \times 100 - 8 \leq 31 \ 0.0001 \times (\theta+5)^3 + 0.1625 \times (\theta+5) + 5.5$$

and $$-30 \leq \theta \leq 20.$$

* * * * *